(12) United States Patent
Lui et al.

(10) Patent No.: US 9,741,851 B2
(45) Date of Patent: Aug. 22, 2017

(54) TRENCH JUNCTION BARRIER CONTROLLED SCHOTTKY

(71) Applicants: Sik K Lui, Sunnyvale, CA (US); Anup Bhalla, Santa Clara, CA (US)

(72) Inventors: Sik K Lui, Sunnyvale, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 30 days.

(21) Appl. No.: 13/892,312

(22) Filed: May 13, 2013

(65) Prior Publication Data

US 2014/0332882 A1 Nov. 13, 2014

(51) Int. Cl.
| | |
|---|---|
| *H01L 29/66* | (2006.01) |
| *H01L 21/336* | (2006.01) |
| *H01L 29/78* | (2006.01) |
| *H01L 29/872* | (2006.01) |
| *H01L 29/06* | (2006.01) |

(52) U.S. Cl.
CPC ...... *H01L 29/7839* (2013.01); *H01L 29/0619* (2013.01); *H01L 29/0623* (2013.01); *H01L 29/66143* (2013.01); *H01L 29/66712* (2013.01); *H01L 29/7806* (2013.01); *H01L 29/7813* (2013.01); *H01L 29/872* (2013.01)

(58) Field of Classification Search
CPC ............. H01L 29/7839; H01L 29/7813; H01L 29/66712; H01L 29/7806; H01L 29/66143; H01L 29/872; H01L 29/0623; H01L 29/0619

See application file for complete search history.

(56) References Cited

U.S. PATENT DOCUMENTS

| | | | | |
|---|---|---|---|---|
| 7,091,552 | B2 * | 8/2006 | Blanchard | H01L 29/0634 257/329 |
| 8,445,370 | B2 * | 5/2013 | Lui et al. | 438/582 |
| 2003/0020134 | A1 * | 1/2003 | Werner et al. | 257/471 |
| 2004/0157384 | A1 * | 8/2004 | Blanchard | H01L 29/0634 438/197 |
| 2005/0176214 | A1 * | 8/2005 | Chang et al. | 438/424 |
| 2005/0258479 | A1 * | 11/2005 | Ono | H01L 29/7813 257/328 |
| 2006/0273383 | A1 * | 12/2006 | Hshieh | H01L 24/26 257/330 |
| 2007/0114599 | A1 * | 5/2007 | Hshieh | 257/330 |

* cited by examiner

*Primary Examiner* — Su C Kim
(74) *Attorney, Agent, or Firm* — Bo-In Lin

(57) ABSTRACT

A method for manufacturing a Schottky diode comprising steps of 1) providing a region with a dopant of a second conductivity type opposite to a first conductivity type to form a top doped region in a semiconductor substrate of said first conductivity type; 2) providing a trench through the top doped region to a predetermined depth and providing a dopant of the second conductivity type to form a bottom dopant region of the second conductivity type; and 3) lining a Schottky barrier metal layer on a sidewall of the trench at least extending from a bottom of the top doped region to a top of the bottom doped region.

16 Claims, 7 Drawing Sheets

TRENCH JUNCTION BARRIER CONTROLLED SCHOTTKY

This Patent Application is a Continuation Application of a co-pending application Ser. No. 12/802,790 filed on Jun. 14, 2010 by common inventors of this Application. Application Ser. No. 12/802,790 is a Divisional Application of application Ser. No. 11/541,189 filed on Sep. 30, 2006 by the Applicants of this Application and now issued as U.S. Pat. No. 7,737,522 on Jun. 15, 2010. The Disclosures made in application Ser. Nos. 11/541,189 and 12/802,790 are hereby incorporated by reference.

BACKGROUND OF THE INVENTION

1. Field of the Invention

The invention relates generally to the semiconductor power devices. More particularly, this invention relates to an improved and novel manufacturing process and device configuration for providing the MOSFET device with shielded trench gates with cells provided with Schottky source contact for improving performance of high frequency power switching, H-bridge and synchronization rectification applications.

2. Description of the Related Art

As the applications of Schottky diodes become more widespread, particularly for reducing the power consumption and increasing the switching speed, it becomes even more important to improve the device configuration and manufacturing processes to reduce the production costs of the Schottky rectifying devices. One particular important consideration is the reduction of the surface areas on the semiconductor substrate occupied by the Schottky diodes. Reduction of the surface-area utilization of the Schottky diodes provides a key to reduce the manufacturing costs and to further miniaturize the size and shape of electronic devices for achieving portability and functionality enhancements. However, in order to achieve the purpose of surface utilization while maintaining current conducting areas, the Schottky diodes are sometimes implemented by filling trenches with a barrier material. The trench Schottky diode configuration leads to another technical difficulty due to the breakdown vulnerability at trench corners where there are sharp edges. In order to overcome such difficulties, a round trench bottom is necessary and that causes the production cost to increase. Due to these reasons, a person of ordinary skill in the art of designing and manufacturing devices including Schottky diodes is still confronted with the technical difficulties and limitations that a reduction of production cost cannot easily achieved.

The Schottky diode has been used to replace PN diodes in many applications. The low forward drop of the Schottky diode in the forward conduction mode reduces the power dissipation of the device. The conduction of the Schottky is through majority carrier, so minority carrier charge storage effects do not occur in the switching characteristics of the device. Therefore the Schottky diode is a preferred over the PN junction diodes in many power applications. FIG. 1A shows a typical Schottky diode where a Schottky barrier metal is contacted to a n-type silicon. The P+ junctions are placed at the edge of the barrier metal contact areas to eliminate the premature breakdown of the device. The forward voltage of the diode is directly proportional to the Schottky barrier height of the metal. It is then desirable to use low Schottky barrier metal to make the diode in order to reduce the conduction loss of the diode. However, the leakage current of the Schottky in the reverse blocking mode is also determined by the Schottky barrier height. Low Schottky barrier height will give rise to higher leakage current in the reverse blocking operation of the diode.

In order to reduce the reverse leakage of the Schottky diode, P-type junctions are placed in the silicon as shown in FIG. 1B. In the reverse blocking mode, the n-silicon is at a higher potential with respect to the Schottky barrier metal. The PN junction is also reverse bias. The depletions from two adjacent p-type junctions merged and shield the surface Schottky barrier from the high reverse voltage thus reduce the leakage current of the diode. The disadvantage of the JBS is the reduced Schottky surface area from the p-type junctions. For higher breakdown voltage Schottky diode, deeper p-type junction is usually required. Deeper junction also has more lateral diffusion. The Schottky area utilization could be quite low for the high breakdown voltage JBS. An alternative way to shield the Schottky barrier from the reverse voltage is the Trench MOS Barrier Schottky as shown in FIG. 1C. With the trench Schottky barrier, the depletions from surrounding the lower portions of the trenches pinch off and shield the Schottky barrier junction on top the mesa. The shape of the trenches affects the breakdown of the dielectric in the trenches. Rounding the bottom and top corners are required to reduce the leakage of the TMBS. The rounding of the sharp corners requires extra process steps and specialized equipment and all these requirements cause an increase in the production costs.

Therefore, a need still exists in the art of implementing the Schottky diodes in the electronic device including the power semiconductor devices to provide new device configuration and manufacturing method in configuring and manufacturing the Schottky diodes to overcome and resolve the above discussed problems and limitations.

SUMMARY OF THE PRESENT INVENTION

It is therefore an aspect of the present invention to provide a new and improved Schottky diode with the junction barrier metal deposited in the trenches with dopant regions for preventing the reverse leakage current disposed on the sidewalls of the trenches and at surrounding the top and bottom corners of the trenches. The depletion from the PN junctions provides the function to shield the Schottky barrier from the reverse voltage. The silicon area utilization is greatly improved and the requirement of a round trench bottom is eliminated such that the above discussed limitations and difficulties of the convention Schottky is resolved.

Another aspect of this invention is to provide new and improved Schottky device configuration to achieve the purpose to improve the silicon area utilization of the junction barrier Schottky (JBS) by forming the Schottky junction on the sidewall of trench.

Another aspect of this invention is to provide new and improved Schottky device configuration that in addition to improve the silicon area utilization of the junction barrier Schottky (JBS) by forming the Schottky junction on the sidewall of trench, the junction barrier Schottky (JBS) formed along the trench sidewalls is combined and integrated with either planar or trenched MOSFET devices to improved the performances of the semiconductor power devices.

Another aspect of this invention is to provide new and improved Schottky device configuration that in addition to improve the silicon area utilization of the junction barrier Schottky (JBS) by forming the Schottky junction on the sidewall of trench, the Schottky device is now manufactured with simplified manufacturing processes with reduced process complexity. Furthermore, the simplified manufacturing processes are implemented with standard processing steps as that commonly implemented for typical MOSFET power device manufacture thus greatly reduce the production cost and can be conveniently combined and integrated with a standard MOSFET device.

Briefly in a preferred embodiment this invention discloses a metal oxide semiconductor field effect transistor (MOSFET) device comprising a plurality of transistor cells wherein each cell having a gate surrounded by body regions encompassing a source region for controlling and conducting a current between the source region near a top surface of a semiconductor substrate and a drain region disposed on a bottom surface of the semiconductor substrate. The MOSFET further comprises a trench disposed between the gates of two adjacent transistor cells wherein the trench is filled with a conductive material extending below the body region of the MOSFET and a trench bottom dopant region having a same conductivity type as the body region surrounded a bottom surface of the trench.

In another preferred embodiment this invention discloses a Schottky diode that includes at least a trenched opened in a semiconductor substrate doped with a dopant of a first conductivity type wherein the trench is filled with a Schottky junction barrier metal. The Schottky diode further includes one or more dopant regions of a second conductivity type surrounding sidewalls of the trench distributed along the depth of the trench for shielding a reverse leakage current through the sidewalls of the trench. The Schottky diode further includes a bottom-doped region of the second conductivity type surrounding a bottom surface of the trench and a top-doped region of the second conductivity type surrounding a top portion of the sidewalls of the trench.

Another embodiment of this invention includes a semiconductor device that includes a Schottky diode includes at least a trenched opened in a semiconductor substrate doped with a dopant of a first conductivity type wherein the trench is filled with a Schottky junction barrier metal. The semiconductor device further includes a dopant region of a second conductivity type surrounding sidewalls of the trench at the top and of the trench for shielding a reverse leakage current through the sidewalls of the trench. The semiconductor device further includes a MOSFET device integrated with the Schottky diode configured as a trench junction barrier Schottky (TJBS) diode. The MOSFET device is integrated with and manufactured simultaneously with the Schottky diode configured as a trench junction barrier Schottky (TJBS) diode. In a preferred embodiment, the MOSFET is a planar MOSFET device integrated and manufactured simultaneously with the Schottky diode wherein the planar MOSFET further includes a body region extending to and surrounding a top portion of the trench of the Schottky diode for shielding the reverse leakage current through the sidewalls of the trench. In another preferred embodiment, the MOSFET is a trench MOSFET device integrated and manufactured simultaneously with the Schottky diode configured as a trench junction barrier Schottky (TJBS) diode wherein the trench MOSFET further comprising trenched gates disposing around the trench of the TJBS diode. The trench MOSFET device further includes a body region extending to and surrounding a top portion of the trench of the Schottky diode for shielding the reverse leakage current through the sidewalls of the trench.

In an exemplary embodiment, this invention further discloses a method of manufacturing a trench junction barrier controlled Schottky device. The method includes steps of opening a trench in a semiconductor substrate of a first conductivity type to a middle depth and implanting a dopant of a second conductivity type at the bottom of the trench by implanting at substantially zero degree into the trench. The method further includes a step of forming a dopant region of the second conductivity type surrounding the sidewalk of the trench near the top surface of the trench for shielding a reverse leakage current through the sidewalls of the trench. Then the method proceeds with another step filling the trench with a Schottky barrier metal. In a preferred embodiment, the step of opening a trench in a semiconductor substrate of a first conductivity type is a step of opening the trench in an N-type semiconductor substrate and the second dopant region is a P-type.

In another exemplary embodiment, this invention further discloses a method of manufacturing a trench junction barrier controlled Schottky device. The method includes steps of opening a trench in a semiconductor substrate of a first conductivity type to a middle depth and implanting a dopant of a second conductivity type to form a middle-depth dopant region of the second conductivity type. The method further includes a step of opening the trench to a full trench depth with the middle-depth dopant region surrounding sidewalls of the trench at about a middle-depth of the trench for shielding a reverse leakage current through the sidewalls of the trench. Then the method proceeds with another step of implanting at substantially at a zero degree into the trench for doping a bottom doped region of the second conductivity type surrounding a bottom surface of the trench. Then the method follows with a step of implanting and doping a top doped region of the second conductivity type surrounding a top portion of the sidewalls of the trench and filling the trench with a Schottky junction barrier metal. In a preferred embodiment, the step of opening a trench in a semiconductor substrate of a first conductivity type is a step of opening the trench in an N-type semiconductor substrate and doping the middle-depth dopant region comprising a P-dopant region. The step of opening the opening the trench to a full trench depth is step of opening the trench to the full depth with non-rounded trench corners.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 2A:
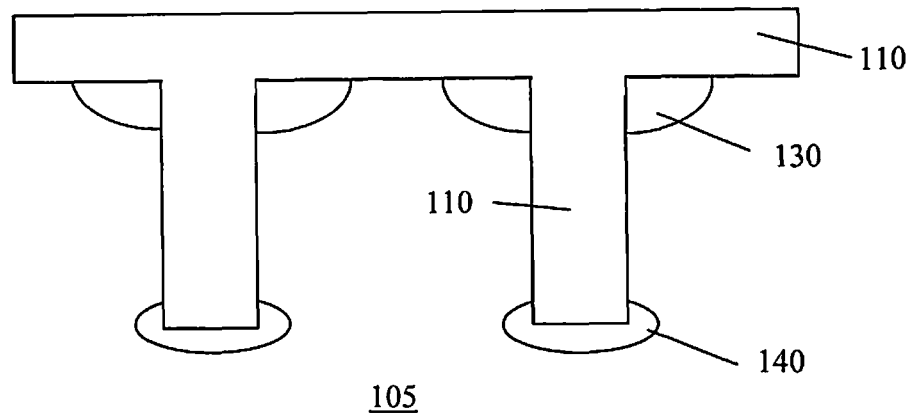
FIGS. 2A and 2B are a cross sectional views of a Schottky diodes of this invention.

Referring to FIG. 2A for a cross sectional view of an Schottky diode 100 of this invention. The Schottky diode 100 is supported and formed in a semiconductor substrate, e.g., a N-doped silicon substrate 105. The Schottky diode 100 includes a plurality of trenches forming a plurality of semiconductor mesas. In the preferred embodiment as shown in FIG. 2A the trenches are filled with Schottky barrier metal, e.g., Ti/TiN or Tungsten metal 110. In another preferred embodiment (not shown), at least a portion of vertical surface of semiconductor mesas is lined with Schottky barrier metal. For the purpose of preventing leakage current generated by the reverse voltage, P-dopant regions 130 are formed on the mesas surrounding the top portions of the trenches and P-dopant regions 140 are formed that surrounding the bottom of the trenches.

As shown in FIG. 2A, P-dopant regions 130 are formed on the top corners of mesas without extending over the whole top surface of mesas. Schottky junctions are also formed on the top surfaces of semiconductor mesas between the P-dopant regions 130. In another embodiment (not shown) P-dopant regions 130 extent allover the spaces between the trenches and no Schottky junctions are formed on the top surfaces. As shown in FIG. 2A, P-dopant regions 140 surround the trenches lower corners and bottom surfaces, no Schottky junctions are formed on the bottom surface. In another embodiment (not shown), P-dopant regions 140 are formed surrounding only the bottom corners and Schottky junctions are formed on a portion of bottom surfaces. By forming the P-dopant regions 140 surrounding the bottom corners of the trenches, the requirements for rounding the trench bottom surfaces are no longer necessary. Furthermore, the silicon utilization for current conduction is greatly improved and the reverse leakage current is effective prevented through the P-dopant regions 130 and 140 to form reverse current shield.

Figure 2B:
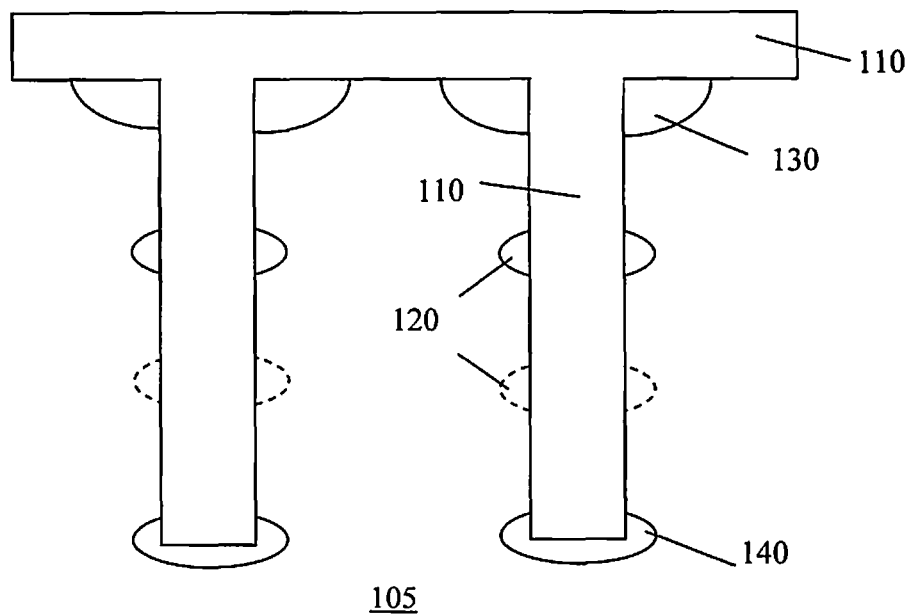

FIG. 2B is a cross sectional view of a Schottky diode 200 with further improvement in the silicon utilization by additional trench sidewall area of deeper trench. The Schottky diode 200 is similar to the Schottky diode 100 except that the trenches in Schottky diode 200 are deeper. Furthermore, one or more P-dopant regions 120 distributed along the depth of the trenches are formed surrounding the sidewalls of the trenches. The reverse leakage current is effective prevented through the P-dopant regions 120, 130, and 140 to form reverse current shield. Furthermore, the silicon area utilization for current conduction is greatly improved by adding more P-doping regions along the sidewall of deeper trenches.

The Schottky devices of FIGS. 2A and 2B achieve the purpose to improve the silicon area utilization of the junction barrier Schottky (JBS) by forming the Schottky diode on the sidewall of trenches. Furthermore, as will be further described below in FIGS. 5A to 5N, a Schottky device shown in FIG. 2B further achieve a purpose to reduce process complexity. The configuration shown in FIGS. 2A and 2B can be manufactured by standard processing steps as that commonly implemented for typical MOSFET power device manufacture thus greatly reduce the production cost and can be conveniently combined and integrated with a standard MOSFET device as that will be further described and explained below.

Figure 1A:
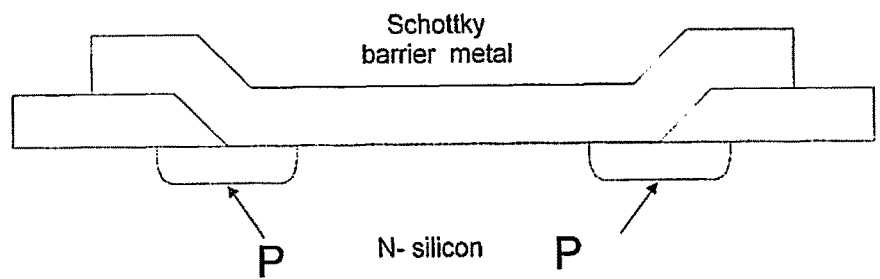
FIGS. 1A to 1C are cross sectional views of Schottky diodes disclosed in prior art disclosures.
Figure 1B:
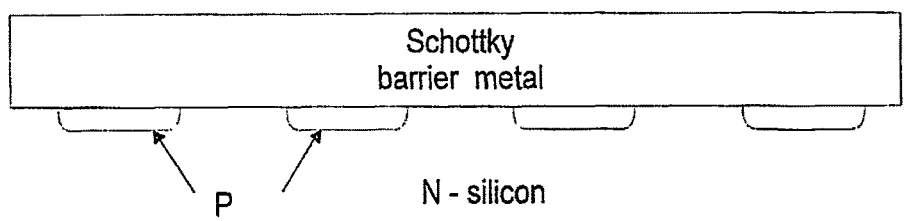
Figure 1C:
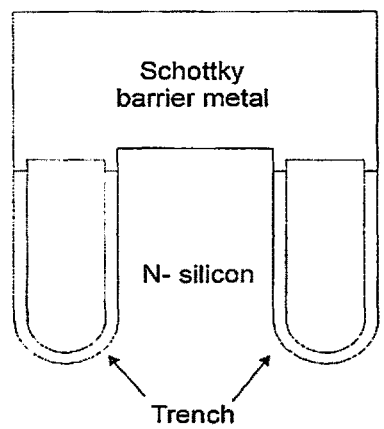

In this invention, the Schottky barrier diode is formed on the sidewall of the trenches. The P-type diffusion regions are formed on the sidewall of the trenches so that the depletions from the PN junctions shield the Schottky barrier from the reverse voltage. There are only two vertical Schottky surface segments are shown in FIG. 2B, but the number of Schottky surface segments can be increased and the number of Schottky trenches cab further increase and is only limited by the manufacture process. The silicon area utilization of this approach greatly exceeds the conventional Schottky implemented with the JBS configurations as that shown in FIGS. 1A to 1C.

Since top and bottom corners of the trenches are surrounded by p-type diffusion. Their curvature will not affect the electric field as the TMBS. The trench junction barrier controlled Schottky as shown in FIGS. 2A and 2B is no longer required to have the trench corners rounded in order to reduce the leakage. Therefore, it is not necessary to carry out a round process. Compared to the trench MOS barrier Schottky of FIG. 1C, the production cost is therefore reduced because of the simplified manufacturing process.

The current invention can also be easily integrated into the Power MOSFET technologies with minimal process complexity. FIG. 5 and FIG. 6 illustrate how this Schottky be integrated into a Planar Power MOSFET and a Trench Power MOSFET technology respectively.

Figure 3:
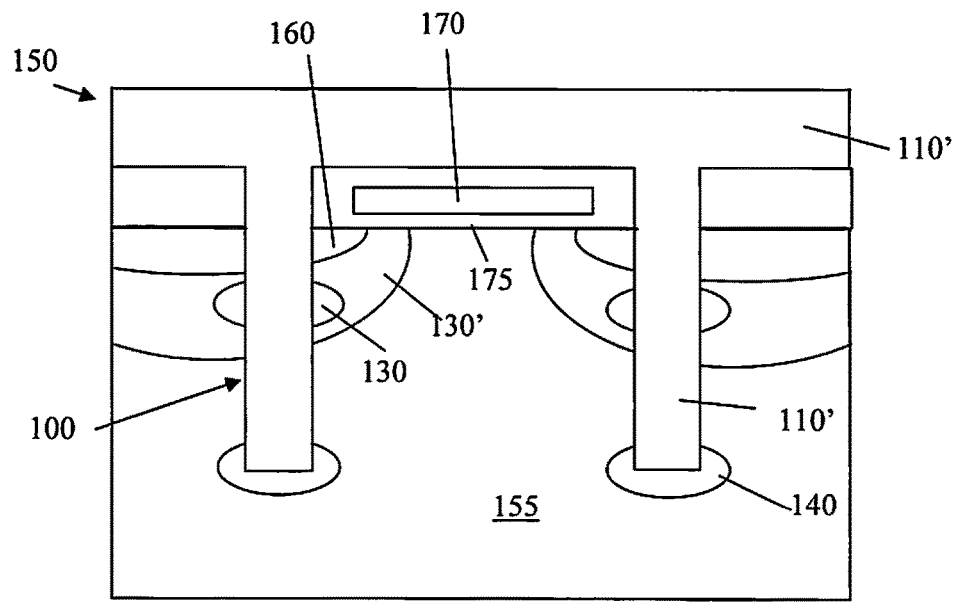
FIGS. 3 and 4 are cross sectional views of showing the diodes according to FIG. 2A integrated with planar and trench MOSFET device respectively.

Referring to FIG. 3 for a planar MOSFET integrated with the trench junction barrier controlled Schottky as that shown in FIG. 2A. The planar MOSFET device 150 is supported on a substrate formed with an epitaxial layer 155. The planar MOSFET device 150 includes a trench junction barrier control Schottky device 100 as that shown in FIG. 2A. The MOSFET device includes body regions 130' that may be thermal diffused regions of the top P-dopant regions of the trench junction barrier controlled Schottky. The planar MOSFET device further includes a source region 160 encompassed by the body regions 130'. A planar gate 170 is disposed on the top surface of the substrate padded with a gate oxide layer 175 controlling a channel formed between adjacent source region 160 and body regions 130'. The trench junction barrier controlled Schottky is electrically connected to a metal contact 110' and the planar gate is electrically connected to a separate gate contact pad (not shown). The source and body contact of MOSFET may be provided through the source and body contacting the metal within the Schottky trench. A higher concentration of body dopant region 130 may be implanted around the Schottky diode trench to increase the concentration of top doped region and to improve the ohmic contact of MOSFET body region.

Figure 4:
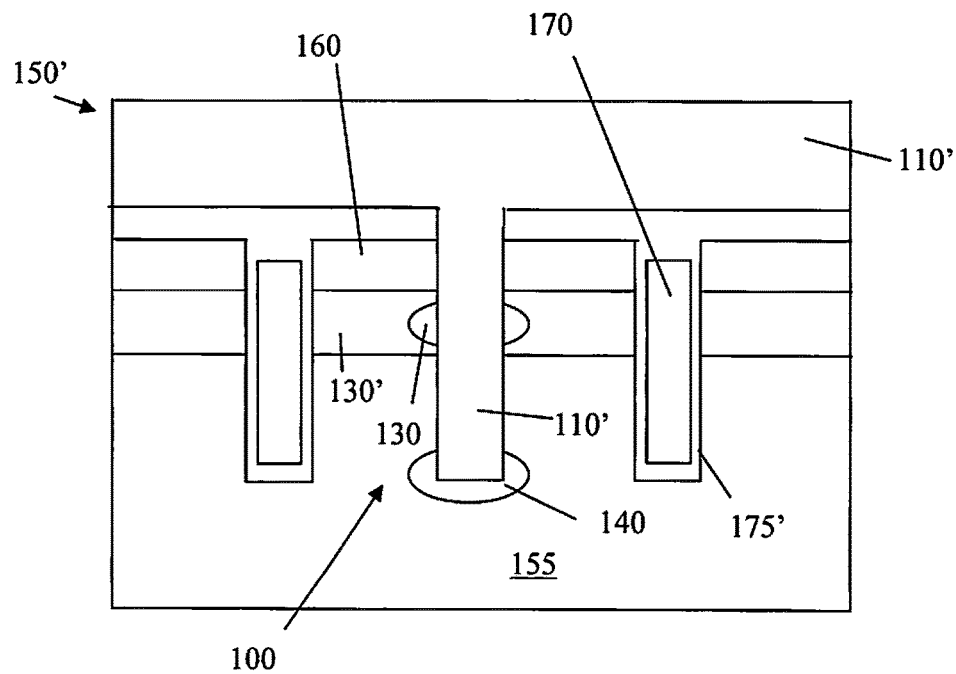

Referring to FIG. 4 for a trenched MOSFET integrated with the trench junction barrier controlled Schottky as that shown in FIG. 2A. The trenched MOSFET device 150' is supported on a substrate formed with an epitaxial layer 155. The trenched MOSFET device 150' includes a trench junction barrier control Schottky device 100 as that shown in FIG. 2A. The MOSFET device includes body regions 130 that may be thermal diffused regions of the P-dopant regions of the trench junction barrier controlled Schottky. The trenched MOSFET device further includes a source region 160 encompassed by the body regions 130. A trenched gate 170' is disposed in a trenched padded with a gate oxide layer 175' between two MOSFET cells controlling a vertical channel formed along the sidewall of the trenched gates 170' between the source regions 160 and a drain disposed at the bottom of the substrate. The trench junction barrier controlled Schottky is electrically connected to a metal contact 110' and the planar gate is electrically connected to a separate gate contact pad (not shown).

Figure 5A:
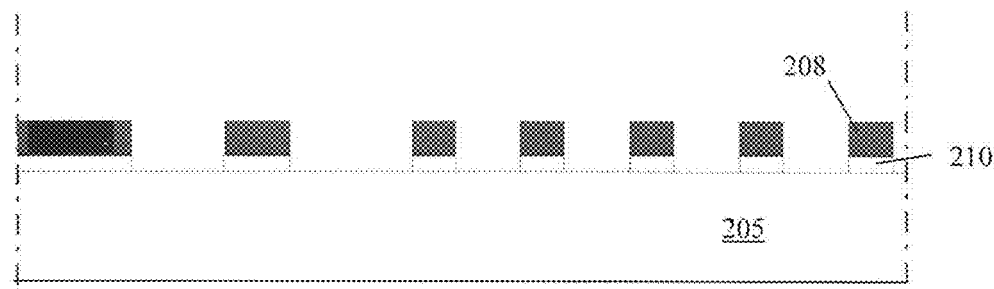
FIGS. 5A to 5N are a serial cross sectional views for describing the manufacturing processes to manufacture a Schottky device of FIG. 2B.
Figure 5B:
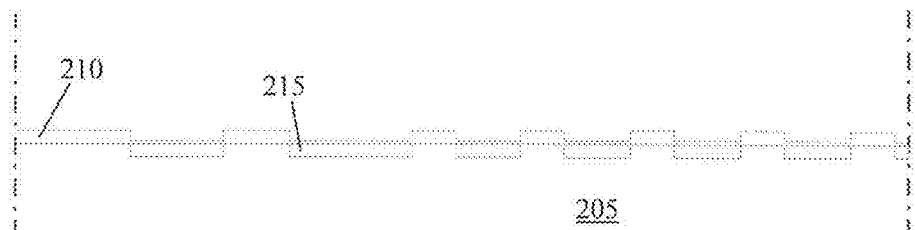
Figure 5C:
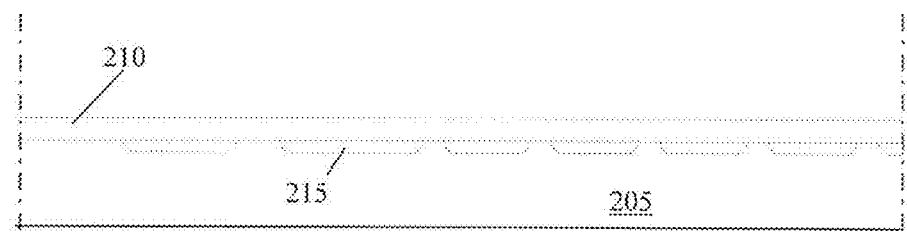
Figure 5D:
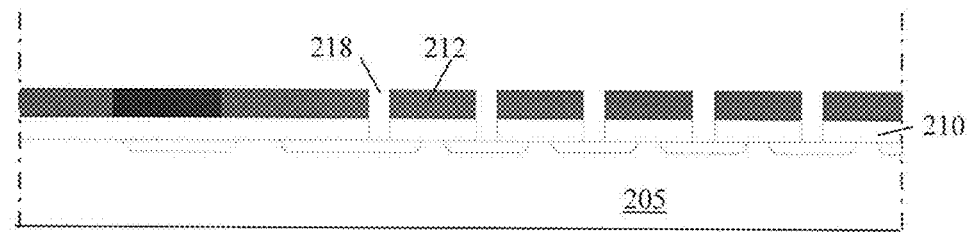
Figure 5E:
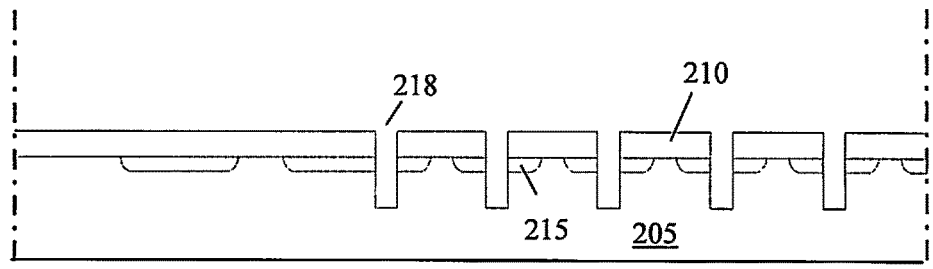
Figure 5F:
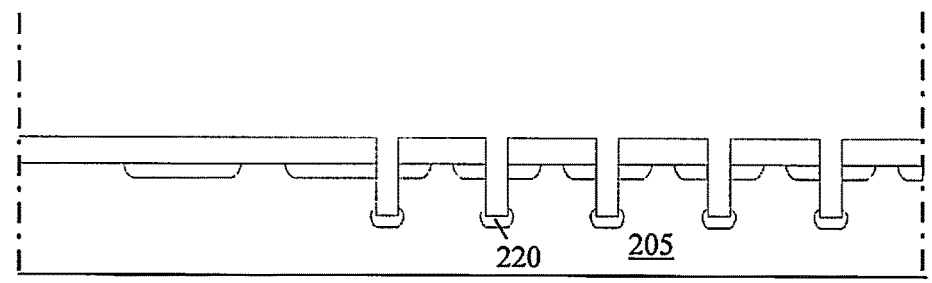
Figure 5G:
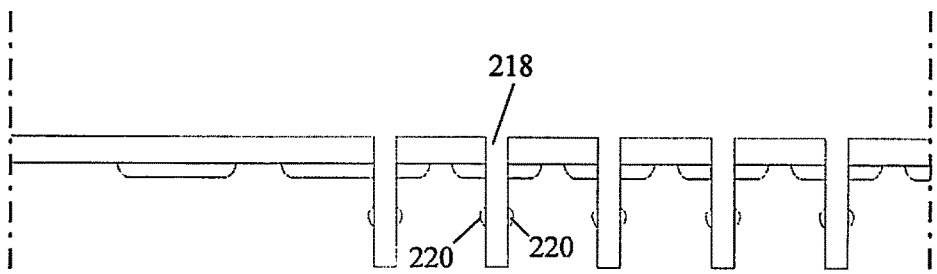
Figure 5H:
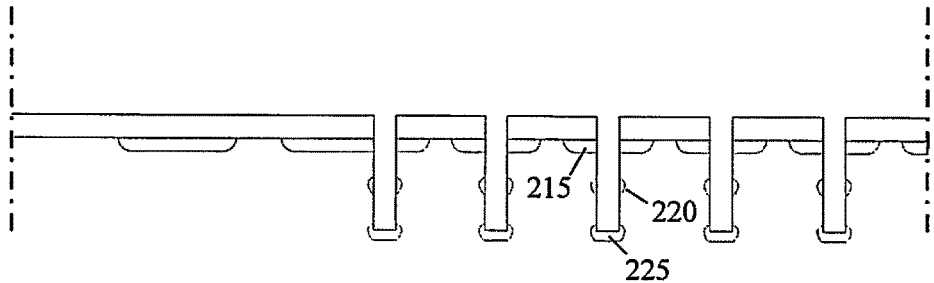
Figure 5I:
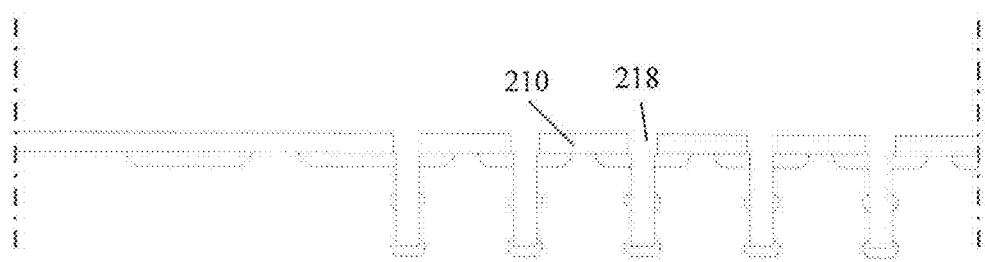
Figure 5J:
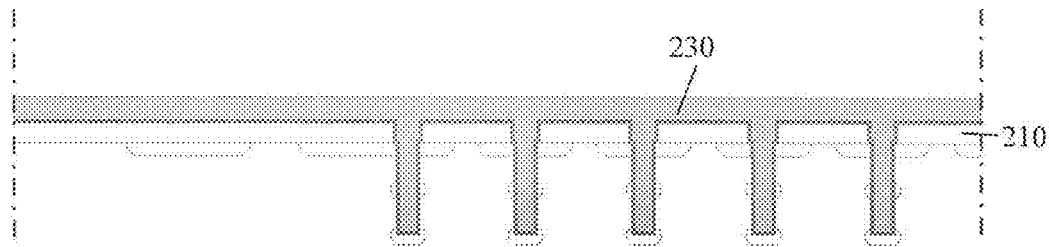
Figure 5K:
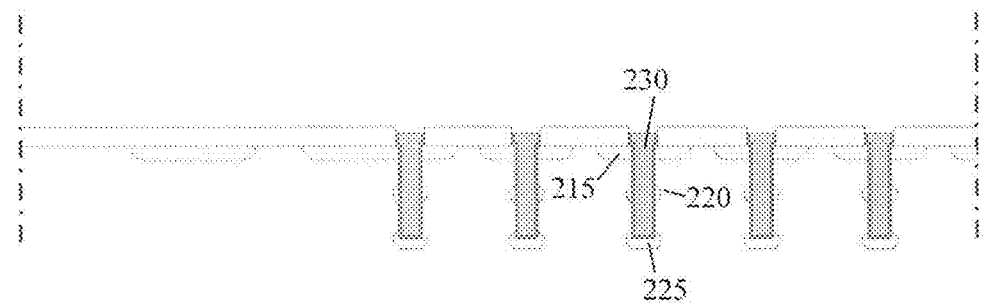
Figure 5L:
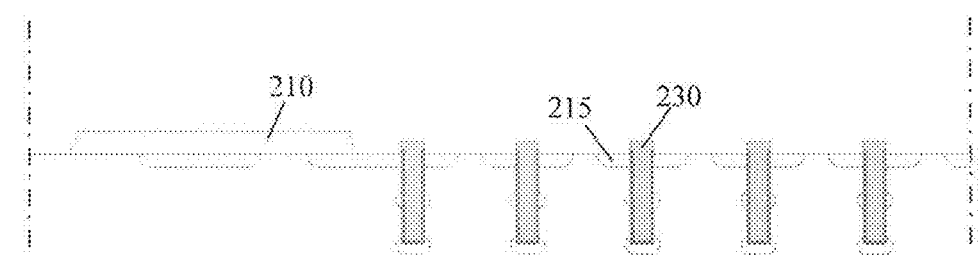
Figure 5M:
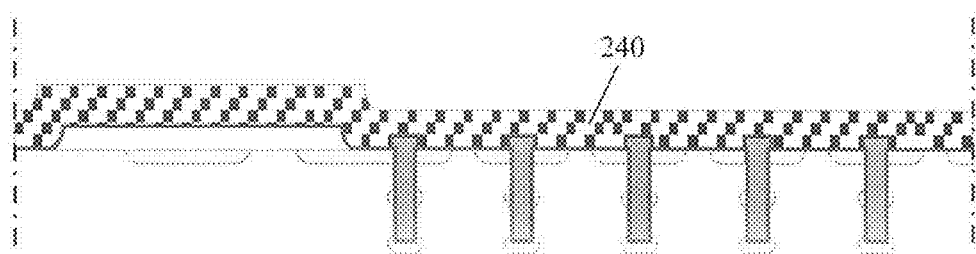
Figure 5N:
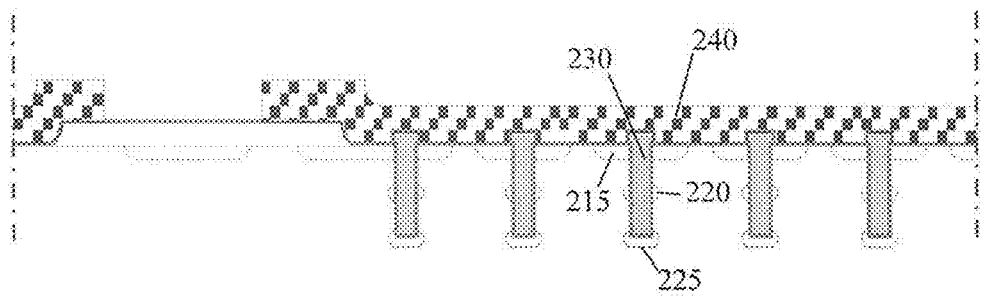

Referring to FIGS. 5A to 5N for a serial of side cross sectional views to illustrate the fabrication steps of a trench junction barrier controlled Schottky device as that shown in FIG. 2B. In FIG. 5A, an initial oxidation is carried out followed by applying a photoresist mask 208 to perform an oxide etch to pattern a plurality of screen oxide layer 210 on top of a semiconductor substrate 205. Referring to FIG. 5B, the photoresist mask 208 is removed followed by carrying out a boron implant to form a plurality of P-dopant regions. In FIG. 5C, an annealing and oxidation process is performed to anneal and grow the oxidation layer 210 covering the entire top surface of the substrate. In FIG. 5D, a trench mask 212 is applied to open a plurality of etch openings 218 in the oxide layer 210.

In FIG. 5E, a silicon etch is performed to open a plurality of trenches 218 then the photoresist 218 is removed. In FIG. 5F, a boron implant at zero degree tilt is carried out and followed by a diffusion to form a plurality of P-dopant regions 220 at the bottom of the trenches 218. In FIG. 5G, a further silicon etch is carried out to etch the trenches into greater depth leaving the P-dopant regions 220 as a ring surrounding the trench sidewalls at about the mid-point of the trenches. In FIG. 5H, a vertical zero degree boron implant is performed to form a P-dopant regions 225 surrounding the trench bottom of the trenches 218.

In FIG. 5I, a wet oxide etch is performed to broaden the trench opening by etching away a portion of the oxide layer 210 away from the trench openings. In FIG. 5J, a thin layer of Ti/TiN is deposited followed by a tungsten layer 230 through chemical vapor deposition (CVD) process. In FIG. 5K, a Ti/TiN or tungsten etch back is carried out to remove the Ti/TiN or Tungsten layer 230 from the top surface. In FIG. 5L, a contact mask is applied to remove the oxide layer 210 from the top surface above the trench. In FIG. 5M, a Ti/TiN/Al contact layer 240 is deposited over the top surface, then in FIG. 5N, a metal mask (not shown) is applied to etch the metal contact layer 240 into contact segment 240 to complete the manufacture of the trench junction barrier controlled Schottky device of this invention.

The semiconductor device includes a Schottky diode formed a on a semiconductor mesa of a first conductivity type, wherein the semiconductor mesa a top doped region of a second conductivity type opposite to the first conductivity type along a top portion of a sidewall. A bottom-doped region of the second conductivity type is disposed along a bottom portion of the sidewall. A portion of the sidewall is lined with a Schottky barrier metal, extending at least from a bottom of the top doped region of second conductivity type to a top of the bottom doped region of second conductivity type. One or more dopant regions of the second conductivity type is disposed along the sidewall distributed along a depth between the top doped region and the bottom doped region and the Schottky barrier metal is completely lining the sidewall. The top doped region of the second conductivity type is formed at a top corner of the semiconductor mesa. The bottom-doped region of the second conductivity type is formed at least around a bottom corner of the semiconductor mesa. The Schottky junction metal overlaying a top surface of the semiconductor mesa forming a Schottky junction in a area between the top doped regions of second conductivity type. The top doped regions are of a second conductivity type extending all over the top-surface the semiconductor mesa and the semiconductor mesa includes non-rounded corners. A MOSFET device is integrated with the Schottky diode configured as a trench junction barrier Schottky (TJBS) diode, and the MOSFET device is manufactured simultaneously with the Schottky diode configured as a trench junction barrier Schottky (TJBS) diode. The semiconductor device further includes a planar MOSFET device integrated and manufactured simultaneously with the Schottky diode wherein the planar MOSFET further includes a body region extending to and surrounding a top portion of the trench of the Schottky diode for shielding a reverse leakage current through the sidewalls of the trench. In a preferred embodiment, the semiconductor device further includes a trench MOSFET device integrated and manufactured simultaneously with the Schottky diode configured as a trench junction barrier Schottky (TJBS) diode wherein the trench MOSFET further includes trenched gates disposing around the trench of the TJBS diode. In a preferred embodiment, the MOSFET device further includes a body region extending to and surrounding a top portion of the trench of the Schottky diode for shielding the reverse leakage current through the sidewalls of the trench.

According to above descriptions, this invention discloses a method for manufacturing an integrated trench junction barrier Schottky (TJBS) diode for a MOSFET device wherein the MOSFET device comprising a plurality of transistor cells and each cell having a gate surrounded by body regions encompassing a source region for controlling and conducting a current between the source region near a top surface of a semiconductor substrate and a drain region disposed on a bottom surface of the semiconductor substrate. The method comprising 1) providing a semiconductor substrate of a first conductivity type and forming a top dopant layer of a second conductivity type below a top surface of the semiconductor substrate; 2) opening a trench between the gates of two adjacent transistor cells through the top dopant layer to a predetermined depth and implanting a dopant of the second conductivity type through the trench to form a bottom dopant region below the trench; and 3) lining a Schottky barrier metal layer on sidewalls of the trench extending from a bottom of said top dopant layer to a top of said bottom dopant region.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A metal oxide semiconductor field effect transistor (MOSFET) device comprising a plurality of transistor cells wherein each cell having a gate surrounded by body regions encompassing a source region for controlling and conducting a current between the source region near a top surface of a semiconductor substrate and a drain region disposed on a bottom surface of the semiconductor substrate wherein the MOSFET wherein:

the semiconductor substrate having a first conductivity type with a top dopant layer of a second conductivity type below a top surface of the semiconductor substrate;

a trench disposed between the gates of two adjacent transistor cells and a trench bottom dopant region having a same conductivity type as the body region surrounded a bottom surface of the trench wherein the trench having sidewalls covering with a Schottky lining extending from a bottom of the top dopant layer to a top of the bottom dopant region and wherein the trench is filled with a conductive material extending below the body region of the MOSFET; and dopant regions having the same conductivity type as the body region surrounded a top-portion of the trench and intermediate dopant regions having the same conductivity type as the body region surrounded a mid-portion of the trench.

2. The MOSFET device of claim 1 wherein:

the trench is filled with a Schottky barrier metal.

3. The MOSFET device of claim 1 wherein:
the trench is filled with a Ti/TiN metal as a Schottky barrier metal.

4. The MOSFET of claim 1 wherein:
the trench bottom dopant region completely surrounding the bottom surface of the trench.

5. The MOSFET device of claim 1 wherein:
the conductive material filling in the trench comprising a barrier metal overlaying a top surface of the semiconductor substrate forming a Schottky junction with said semiconductor substrate in an area between the gates of the adjacent transistor cells.

6. The MOSFET device of claim 1 wherein:
said trench comprising non-rounded trench corners near the bottom surface of the trench.

7. The MOSFET device of claim 1 wherein:
the gate is a planar gate comprising a conductive layer extended laterally over substantially a mid-porting in each of the transistor cell above the body and source regions.

8. The MOSFET device of claim 1 wherein:
the gate is a trench gate comprising a gate-trench filled with a gate conductive material extended vertically in substantially a mid-porting of each of the transistor cell surrounded by the body and source regions.

9. The MOSFET device of claim 1 wherein:
the trench is filled with a Schottky barrier metal constituting an integrated trench junction barrier Schottky (TJBS) diode.

10. A method for manufacturing an integrated trench junction barrier Schottky (TJBS) diode for a MOSFET device wherein the MOSFET device comprising a plurality of transistor cells and each cell having a gate surrounded by body regions encompassing a source region for controlling and conducting a current between the source region near a top surface of a semiconductor substrate and a drain region disposed on a bottom surface of the semiconductor substrate, the method comprising:

providing a semiconductor substrate of a first conductivity type and forming a top dopant layer of a second conductivity type below a top surface of the semiconductor substrate;

opening a trench between the gates of two adjacent transistor cells through the top dopant layer to a predetermined depth and implanting a dopant of the second conductivity type through the trench to form a bottom dopant region below the trench;

lining a Schottky barrier metal layer on sidewalls of the trench extending from a bottom of said top dopant layer to a top of said bottom dopant region; and forming an intermediate dopant region of said second conductivity type surrounding the sidewalls of the trench at a top-portion of the trench and at a mid-portion of the trench.

11. The method of claim 10 further comprising:
implanting at substantially at a zero degree into said trench for doping the bottom dopant region of said second conductivity type surrounding a bottom surface of said trench.

12. The method of claim 10 further comprising:
filling said trench with a Schottky barrier metal.

13. The method of claim 10 wherein:
said step of opening a trench in a semiconductor substrate of the first conductivity type is a step of opening said trench in a N-type semiconductor substrate and doping said dopant region with a P-dopant.

14. The method of claim 10 further comprising:
filling said trench with a Ti/TiN metal as a Schottky barrier metal.

15. The method of claim 10 wherein:
filling said trench with a tungsten metal as a Schottky barrier metal.

16. The method of the claim 10 wherein:
said step of opening said trench to said predetermined depth comprising step of opening said trench to said predetermined depth with non-rounded trench corners.

* * * * *